(12) United States Patent
Byrnes

(10) Patent No.: US 10,742,039 B2
(45) Date of Patent: Aug. 11, 2020

(54) BARGE-BASED SOLAR/WIND/WAVE ENERGY COLLECTION

(71) Applicant: John T. Byrnes, Marietta, NY (US)

(72) Inventor: John T. Byrnes, Marietta, NY (US)

(73) Assignee: FSWM Technical Enterprises, Inc., Marietta, NY (US)

( * ) Notice: Subject to any disclaimer, the term of this patent is extended or adjusted under 35 U.S.C. 154(b) by 0 days.

(21) Appl. No.: 15/877,885

(22) Filed: Jan. 23, 2018

(65) Prior Publication Data
US 2018/0212432 A1 Jul. 26, 2018

Related U.S. Application Data

(60) Provisional application No. 62/450,097, filed on Jan. 25, 2017.

(51) Int. Cl.
*H02S 20/00* (2014.01)
*H02S 40/36* (2014.01)
(Continued)

(52) U.S. Cl.
CPC .............. *H02J 3/383* (2013.01); *F03B 13/14* (2013.01); *F03B 13/142* (2013.01); *F03B 13/1815* (2013.01); *F03B 13/24* (2013.01); *F03D 9/007* (2013.01); *F03D 9/008* (2013.01); *F03D 9/10* (2016.05); *H02J 3/386* (2013.01); *H02S 20/00* (2013.01); *H02S 40/36* (2014.12); *F05B 2220/708* (2013.01); *F05B 2240/93* (2013.01); *F05B 2260/02* (2013.01);
(Continued)

(58) Field of Classification Search
CPC . F03D 9/008; F03D 9/007; F03D 9/10; H02S 20/00; H02S 40/36; F03B 13/142; F03B 13/1815; F03B 13/24; F03B 13/14; F05B 2220/708; F05B 2240/93; F05B 2260/02; H02J 3/383; H02J 3/386; H01L 31/05
See application file for complete search history.

(56) References Cited

U.S. PATENT DOCUMENTS 3,326,497 A * 6/1967 Michelson ............. B64G 1/443
244/172.7
4,553,037 A * 11/1985 Veazey .................... F03D 9/25
290/55
(Continued)

*Primary Examiner* — Golam Mowla
(74) *Attorney, Agent, or Firm* — Bernhard P. Molldrem, Jr.

(57) ABSTRACT

A floating power generation station comprises a floating hull with a shelter structure containing photovoltaic solar panels are arranged on a chain of floats, each hinged one to the next. The system can be deployed onto a large flat area, e.g., surface of inlet or bay, where the solar panel chain(s) can be extended out. The power generation station may include air displacement tubes that have a lower end immersed in water, and which feed into a plenum where check valves direct air unidirectionally to an air turbine that powers an electric generator. Air turbines or wind turbines on the barge can be raised or tipped up for collection of wind energy. The captured energy is stored on a bank of on-board storage batteries. Energy can be collected and stored, and the barge can be brought to shore when and where needed. This arrangement can be configured for ground-based deployment. The power generation station can be configured for use on dry land.

10 Claims, 17 Drawing Sheets

(51) Int. Cl.
*H01L 31/05* (2014.01)
*H02J 3/38* (2006.01)
*F03B 13/14* (2006.01)
*F03D 9/10* (2016.01)
*F03B 13/24* (2006.01)
*F03B 13/18* (2006.01)
*F03D 9/00* (2016.01)

(52) U.S. Cl.
CPC ............... *H01L 31/05* (2013.01); *Y02E 10/32* (2013.01); *Y02E 10/38* (2013.01); *Y02E 10/72* (2013.01)

(56) References Cited

U.S. PATENT DOCUMENTS

| | | | |
|---|---|---|---|
| 5,236,378 A * | 8/1993 | Newman | B60L 8/00 114/95 |
| 5,280,270 A * | 1/1994 | Correa | B60Q 1/52 340/471 |
| 5,289,999 A * | 3/1994 | Naujeck | H01L 31/048 136/244 |
| 5,512,787 A * | 4/1996 | Dederick | F03D 9/008 290/4 R |
| 5,770,893 A | 6/1998 | Youlton | |
| 6,000,353 A * | 12/1999 | De Leu | B63B 34/50 114/61.1 |
| 6,147,294 A * | 11/2000 | Dailey | B64G 1/222 136/245 |
| 7,047,902 B1 * | 5/2006 | Little | B63B 17/02 114/292 |
| 7,105,940 B2 | 9/2006 | Weesner et al. | |
| 7,453,164 B2 | 11/2008 | Borden et al. | |
| 7,564,144 B1 | 7/2009 | Srybnik et al. | |
| 8,193,651 B2 | 6/2012 | Lightfoot et al. | |
| 8,564,151 B1 | 10/2013 | Huebner | |
| 8,772,957 B2 | 7/2014 | Willingham | |
| 8,866,321 B2 | 10/2014 | McCormick et al. | |
| 9,410,299 B2 | 8/2016 | Pierce, Jr. | |
| 9,435,317 B2 | 9/2016 | Cunningham et al. | |
| 2008/0196758 A1 * | 8/2008 | McGuire | F03D 9/007 136/245 |
| 2009/0133732 A1 * | 5/2009 | Hsia | H02S 40/36 136/206 |
| 2009/0315330 A1 * | 12/2009 | Dederick | F03B 13/268 290/53 |
| 2011/0146751 A1 * | 6/2011 | McGuire | F24S 25/33 136/245 |
| 2013/0240015 A1 | 9/2013 | Chaimovski et al. | |
| 2014/0152017 A1 | 6/2014 | Bhusri | |
| 2014/0338720 A1 * | 11/2014 | Caster | H02S 10/00 136/245 |
| 2015/0035283 A1 | 2/2015 | Lee | |
| 2016/0036375 A1 | 2/2016 | Ansari | |
| 2016/0156304 A1 | 6/2016 | Smadja et al. | |

* cited by examiner

BARGE-BASED SOLAR/WIND/WAVE ENERGY COLLECTION

The priority is claimed under 35 U.S.C. 119(e) of my provisional application Ser. No. 62/450,097, filed Jan. 25, 2017, the disclosure of which is incorporated herein by reference.

BACKGROUND OF THE INVENTION

The threat of a loss of electric power due to hurricanes or other storms, as well as the possibility of loss grid power from accidental or deliberate attack on the power grid has become much greater in recent years, as dependency on supplied electric power has grown. In many cases, if a power generation or power substation goes off-line for any reason, it may take at least a few days and up to a number of weeks to restore power to customers. Also, during severe temperature conditions, the power draw for air conditioning or heating can create a power brown-out condition where the power generation equipment cannot keep up with power demand. Consequently power generation capability, to provide power back-up and also to provide supplemental power during times of peak demand, is a definite requirement to assure day-to-day needs are met for electricity, both residential and commercial.

Ideally, back up power can be supplied from natural or renewable primary power sources, e.g., solar or photovoltaic (PV) panels, wind power, or from wave action of ocean waves or waves on a large body of water such as a large lake, bay or bayou. Favorably the power generated there can be stored and later made available from storage batteries, or another storage means such as compressed air. In an ideal situation, energy can be collected and stored at an out-of-the way location, and then brought to a municipality or other location when the supplemental or back-up power is needed. Also, because the location of storm damage is not known in advance, the back up or supplemental energy storage system should be mobile or transportable, so that it can be quickly brought to the location where the power is needed, and then returned to a remote or out-of-the way energy collection location when the crisis ends.

The proposed solution to this employs a floating or otherwise transportable collection station, including energy collection source(s)—solar, wind, wave action, and means for storing the energy, e.g., a bank of storage batteries, and delivering the energy to the local or regional power system when the station is brought to the destination where supplemental or back-up power is needed.

The overall concept concerns a moderate-to-large energy collection and storage system that can be transported as needed, collect electric energy from solar panels that can be quickly deployed and retrieved, and also using an air turbine to generate electricity, and to store energy derived from wave action, and optionally can include wind turbines for this purpose.

Unlike the so-called energy farm with fixed-in-place wind power, solar, or water power generation, the present invention locates wind, wave, and solar generation equipment on a barge or floating vessel (or alternatively on one or more rail cars or truck-based containers or trailers) with equipment that can be deployed out from a storage housing or container module at a location where there is open space where arrays of the solar or PV panels can be deployed. In a water setting, e.g., on a lake or bay, vertical tubular wave energy based power generators can be immersed into the water, and chains of interconnected floating PV panels can be extended out onto the water. The equipment may also include deployable and retractable wind turbine towers. The barge or vessel can be transported, with the power collection equipment withdrawn into storage or travel mode, and brought to a seaport, lake port or river port at the target location where the supplemental or replacement power is needed, and the stored energy can be placed into the local or regional power system from that point.

Solar power, wave-action power, and wind power may each be used as primary power for charging the on-board battery bank energy storage, and the stored energy from battery storage can be used later to generate electrical power ashore at proper voltage, phase, and frequency where the power is needed.

A land based system can deploy a chain of solar panels across a flat space, e.g. a large parking lot, and may also include a wind turbine to capture wind energy. Wheels or rollers may be used with the linked-up photovoltaic panels, rather than floats.

OBJECTS AND SUMMARY OF THE INVENTION

In the system according to an embodiment of this invention, photovoltaic solar panels are arranged on a chain of floats or backing panels, i.e., buoyant panels or rolling platforms, each hinged one to the next (much like the treads of a tracked vehicle). These are contained in a storage structure, e.g., a steel storage container, that is carried on a barge or other large vessel, or by rail or truck, where the system can be deployed onto a large flat area, e.g., surface of inlet, bay, lake or pond, or open parking lot, where the solar panel chain(s) can be extended out for some distance. The system for water bodies also has an arrangement of air displacement tubes that have a lower end immersed in water, and which feed into a plenum with an arrangement of check valves so that the air in the tubes that is displaced by wave action in the body of water is fed to an air turbine that powers an electric generator. The system of check valves or louvers ensures that air flow into the turbine is unidirectional. Air turbines or wind turbines on the barge can be raised or tipped up for collection of wind energy. The captured energy is stored on a bank of on-board storage batteries, so that energy can be collected and stored before it is needed, and the barge can be brought to shore when and where the energy is needed, and the stored energy can be fed into the municipality's electric system as needed to supplement the generated electricity. These barges can be stored at a port, out of the way of navigation, and then brought within a short time to a place where power is needed, e.g., following a hurricane, other storm, or any other power outage or emergency.

The principal object is to be able to "farm" energy from open waterways of the world using readily available renewable energy collection equipment, e.g., PV solar, wave energy, wind turbine, in a form that can be deployed quickly and quickly retracted, primarily in any open-water environment, i.e., fresh water or salt water, but can be adapted for on-shore or edge-water locations.

Main important features are as follows:

a. Rapid deployment/rapid retraction methods and mechanisms for a large-area floating solar or PV array, i.e., interlocking plastic floats custom fitted to solar PV panels, roller wheels, other retractions systems. The PV panels may be "thin film" PV and can be attached to the floats for easy deployment upon open waterways and easy retraction when conditions dictate.

b. Methods and equipment to clean the solar panels may be used at the time of deployment or retraction to remove debris and/or residue that might impede the energy collection capabilities of the PV panels, including spray or mechanical wash, radiant or air drying.

c. Rapid deployment/rapid retraction methods or mechanisms for wind and wave energy collection devices e.g., windmills or hydrokinetic energy devices, can include collapsible or extending support frames, folding or hinged wind turbine towers, moveable mounting frames for hydrokinetic energy collection devices.

d. Forced air displacement tube arrangements can utilize inlet and outlet check valves to move displaced air into a common plenum for use in a low static pressure air turbine system. The forced air displacement tubes are inserted into the body of water when there is wave action occurring. As the troughs and crests of the waves move past the tube(s) the water level rises and falls within the tube displacing a volume of air through the outgoing check valve into the common plenum. Then when the wave peaks and the trough approaches the outlet check valve closes and the inlet check valve opens, allowing outside air to enter the forced air displacement tube. As each new wave passes the forced air displacement tube, the cycle is repeated. Multiple tubes increase the total displaced air volume. The displaced air may be stored in a pressurized air storage device or a containment, e.g, a bellows or inflatable bladder or balloon.

e. Pressurized air storage enhances flow and allows for a more constant air turbine fan speed. These storage devices may include bellows, large pistons or large inflatable balloons or bladders, and can be coupled to the common plenum and the pressure side of the air turbine.

f. A low-static-pressure air turbine uses the air from the air storage device (bellows, balloon, piston or bladder) for storing energy, eliminating the need for a flywheel for each turbine.

g. Combinations of the wind, wave action, and photovoltaic energy collection devices feed on-board battery banks to store the energy. The barge may also house ice-making equipment and/or water filtration equipment and/or desalinization equipment.

h. The combination of features and equipment may be installed on land (e.g., at a pier, a spar, a water-break or other water-adjacent location) rather than on a vessel.

I. Rather than a floating structure such as a boat or barge, the equipment may be installed on a platform in the body of water or on a tethered floating structure. Alternatively, land-based systems may be deployed in open land areas, such as parking lots.

j. Equipment for converting the stored energy to high-voltage AC to feed the local power system can be on-board or may be on shore to receive the DC energy from the storage battery banks on board the barge.

k. In place of a forced air displacement tube arrangement as discussed above in paragraph e., a float and bellows assembly may be used. The float is mechanically connected to a variable-volume air chamber, such as a bellows assembly or a piston assembly. The variable-volume air chamber may be designed with levers to increase the volume of air displaced from the variable-volume air chamber. The movable frame that supports the float and the variable-volume air chamber is deployed into the wave action. As the crest of the wave rises beneath the float, the float acts to collapse the bellows, piston or other variable-volume air chamber and force the displaced air out through an outflow check valve and then to a turbine, generating electricity. As the wave recedes, the float drops downward vertically due to gravity, causing the volume within the variable-volume air chamber to increase. Air is forced into the variable-volume air chamber, through an inflow check valve, with atmospheric pressure being higher than the pressure within the variable-volume air chamber. The flow of air may be routed through a plenum or duct, which is connected to a turbine. With each wave this cycle repeats.

BRIEF DESCRIPTION OF THE DRAWING

The arrangement of this invention is shown in schematic form in the Drawing Figures.

DETAILED DESCRIPTION OF PREFERRED EMBODIMENT(S)

Figure 1:
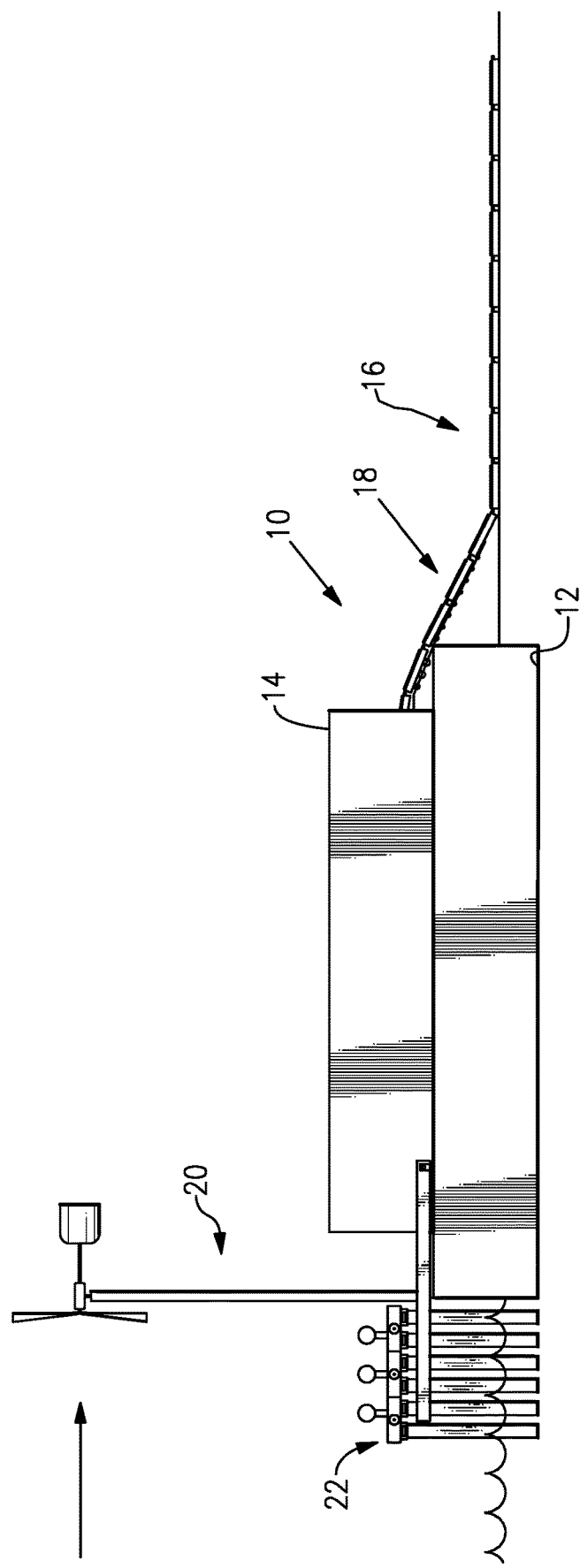
FIG. 1 is a front view of an emergency-power vessel according to one embodiment of this invention.
Figure 2:
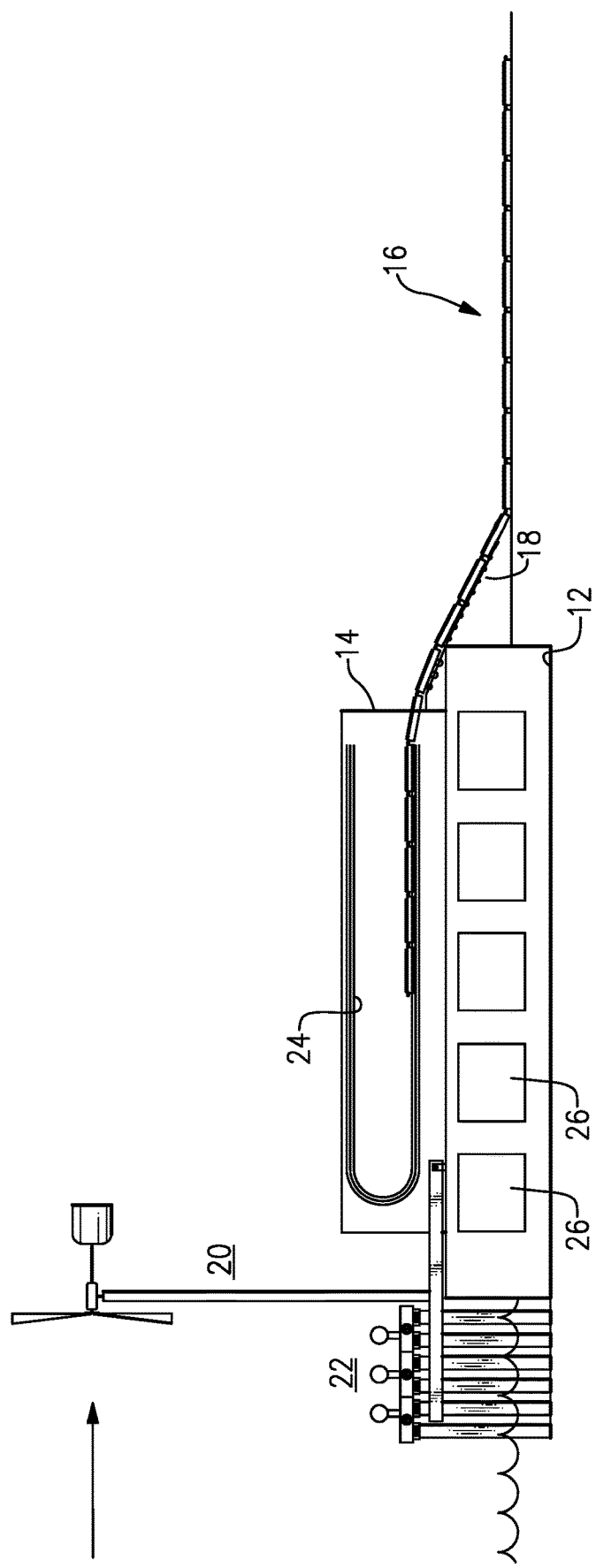
FIG. 2 is another front view thereof, here cut-away to reveal a folded track for storage and deployment of the chain array of floating photovoltaic panels.
Figure 3:
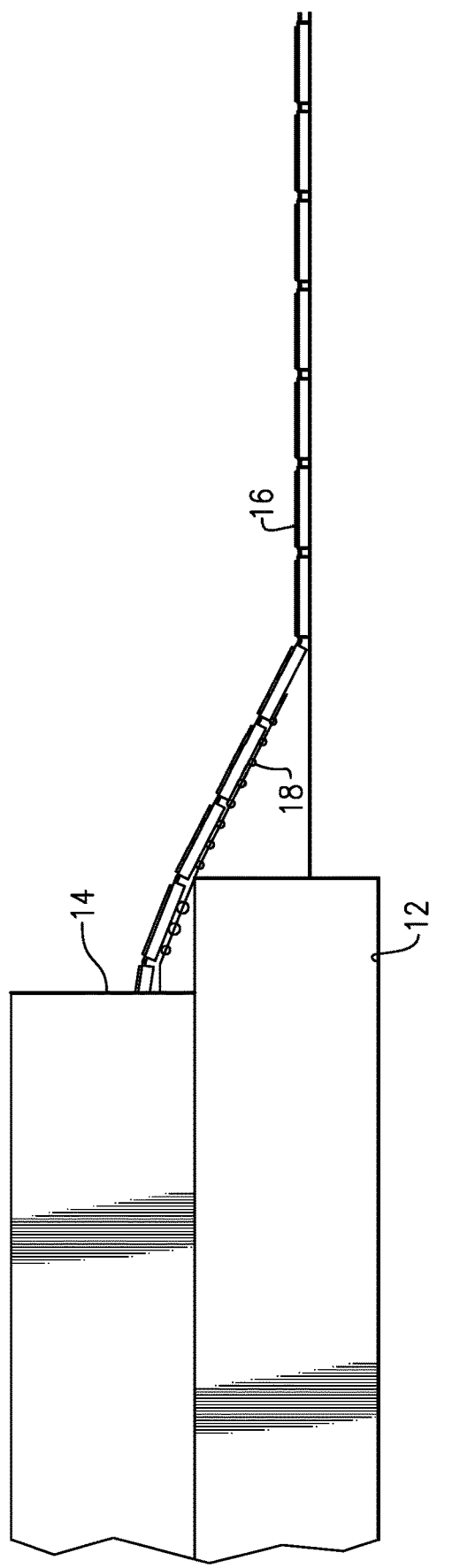
FIG. 3 is a partial view thereof showing deployment or retraction of the photovoltaic panels to or from the water surface.

With reference to the Drawing Figures, and initially to FIG. 1, which is a front or bow-end view of the floating emergency power generating station 10 or energy generation vessel, with a barge main hull 12 (or equivalent floating vessel or hull) showing a storage housing 14 or shelter on a deck of the barge 12 for deploying and redeploying (back into the housing) a chain 16 of interconnected floating PV panels, with a deployment ramp 18 for angling the PV panels gently down to the level of the water surface. A similar system can be used on a land-based system to deploy the solar panels along a flat area of ground. A wind turbine assembly 20 is provided, one for each chain of PV panels; and (for water-based systems) a wave action power collection array 22 with vertical, partly immersible forced air tubes and an air turbine, discussed in detail later. These items 20 and 22 are on the side of the barge away from the deployed PV panels. As shown in FIG. 2, the storage housing may have a track 24 for on which the PV panels travel within the shelter 14 and can coil into two or more layers. Also seen in FIG. 2 there are storage batteries 26 within the barge hull that are charged by the solar, water wave and wind apparatus, and can be used as a source of general output power. As depicted in FIGS. 1 and 3, the wind and wave-action portions are fully deployed, but the floating PV panels in the process of being deployed or extended out from the barge onto the surface of a body of water.

FIG. 3 is a schematic view illustrating the deployment or extension/redeployment or retraction of an array or chain 16 of interconnected floating PV panels from/into the housing or container for the PV panels to or from the water surface, and here illustrating the position of a deployment ramp 18 from the container or housing to the water surface. A similar array, but with rollers or wheels on the floats or on a backing in place of the floats, can be used for deploying on a land surface.

Figure 4:
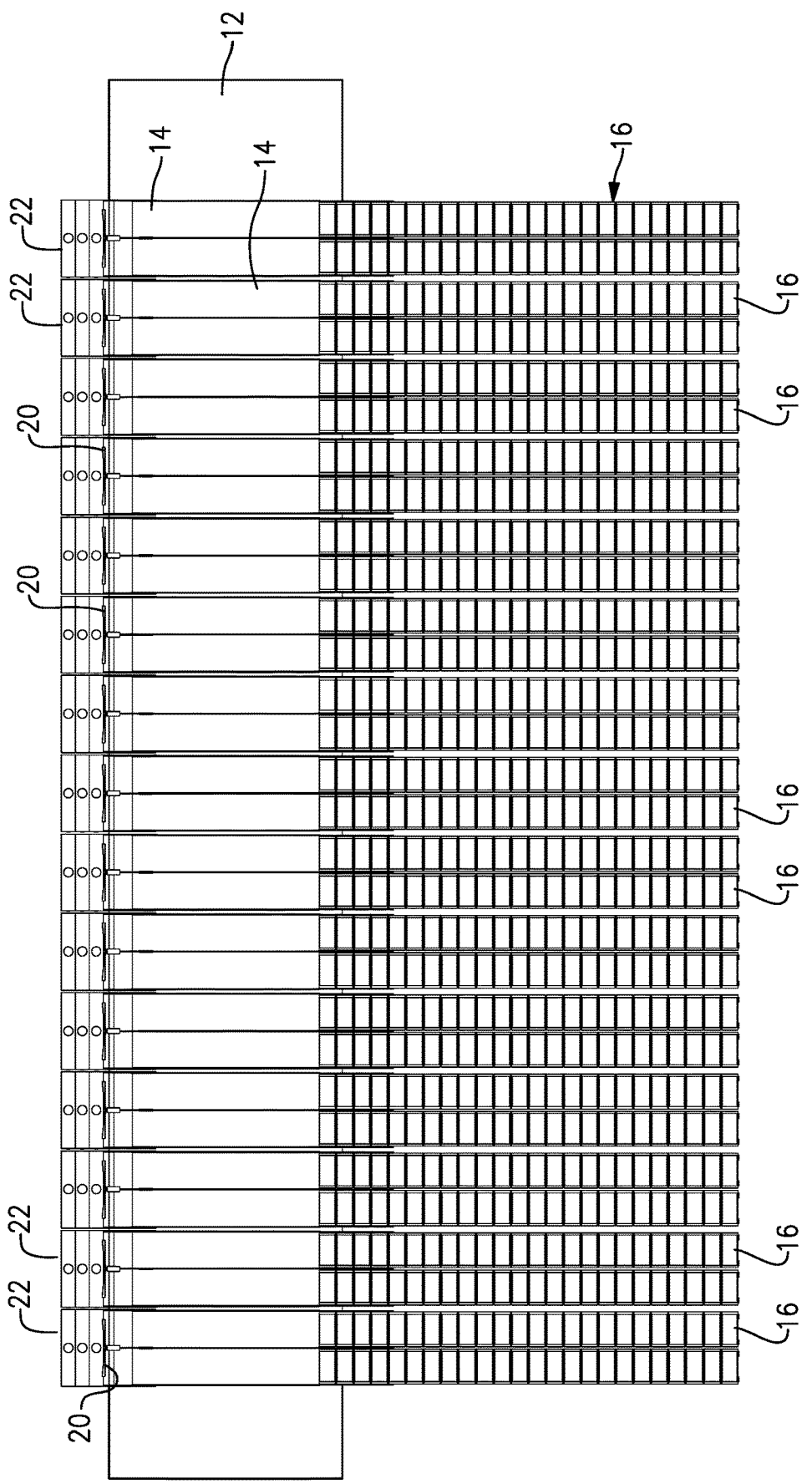
FIG. 4 is a top plan view of the emergency power vessel showing the multiple photovoltaic panel chains deployed out alongside the vessel.

FIG. 4 is a schematic top or plan view of the floating power generation station 10, illustrating a number of arrays of deployed interconnected PV or solar panels chains 16 on one side (here, the port side) of the barge, and multiples of wind turbines 20 and wave-action generation modules 22 at the other side (i.e., starboard side) of the barge.

Figure 5:
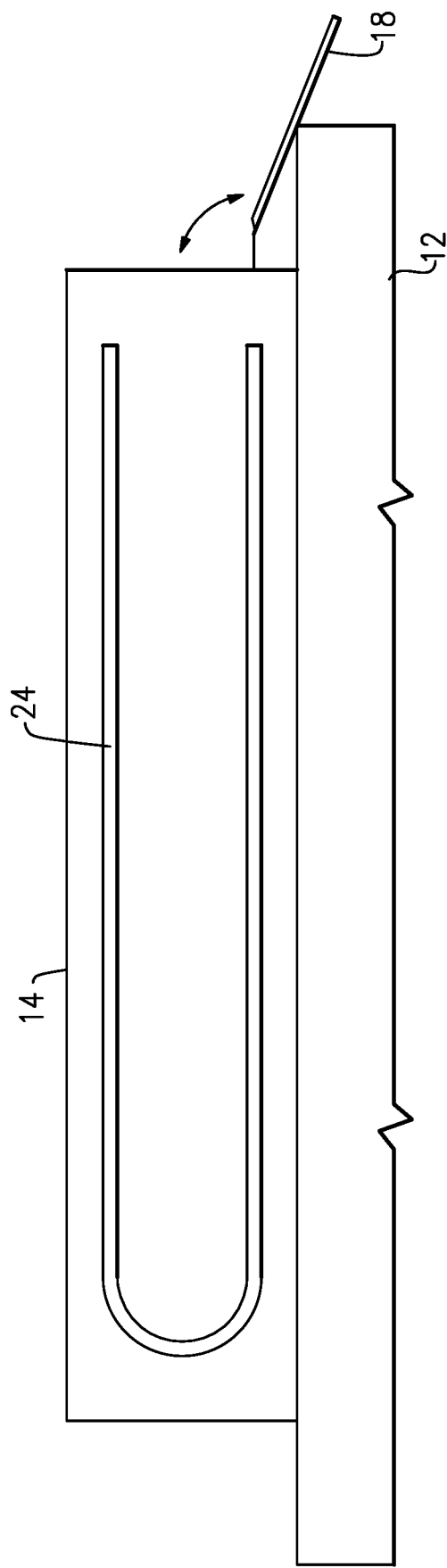
FIG. 5 is a cut-away of a deployment housing (e.g. container module) for the interconnected floating PV panels, illustrating a coiled retraction/deployment track, with the hinged deployment ramp.
Figure 14:
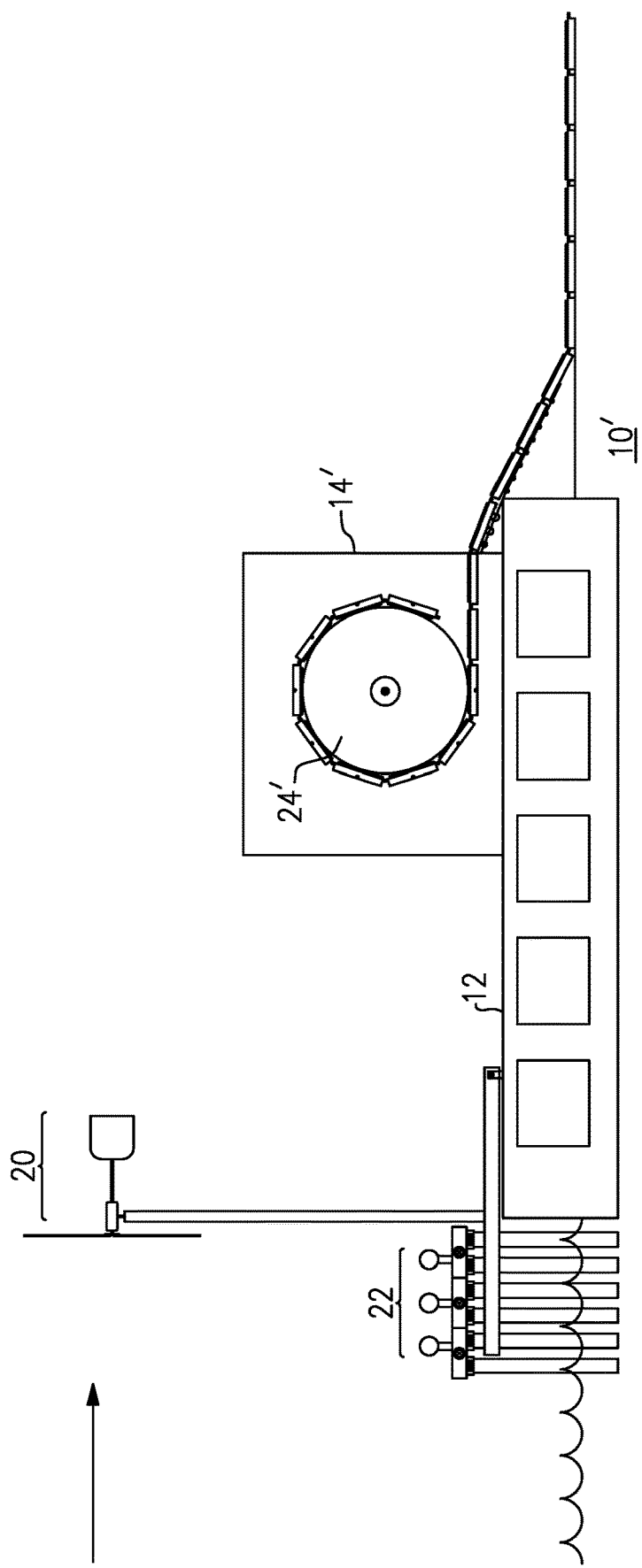
FIG. 14 is a front or bow-end view of the power generating station, partly cutaway, again showing the arrangements of wind, wave, and solar energy collection equipment, and the chain of photovoltaic panels being deployed out.

FIG. 5 is a schematic cut-away of a deployment housing 14 (i.e., container module) for the interconnected floating PV panel chains 16 illustrating the coiled retraction/deployment track 24, with the hinged deployment ramp 18 that opens and folds down to the water level (or land surface) for deployment from and redeployment to the track from within the housing or container 14. In this embodiment, the housing is a steel container and the tracks are channel members similar to the tracks used for overhead doors to receive wheels or rollers 30 at the sides of the PV panels. An alternative design could employ a windlass type configuration or roller drum (as shown in FIG. 14) to rotate and roll-up the array of solar panels. Here, the deployment housing could be formed of one or a series of steel shipping containers, typically dimensioned twenty feet by eight feet by eight feet, although the dimensions are not critical.

Figure 6:
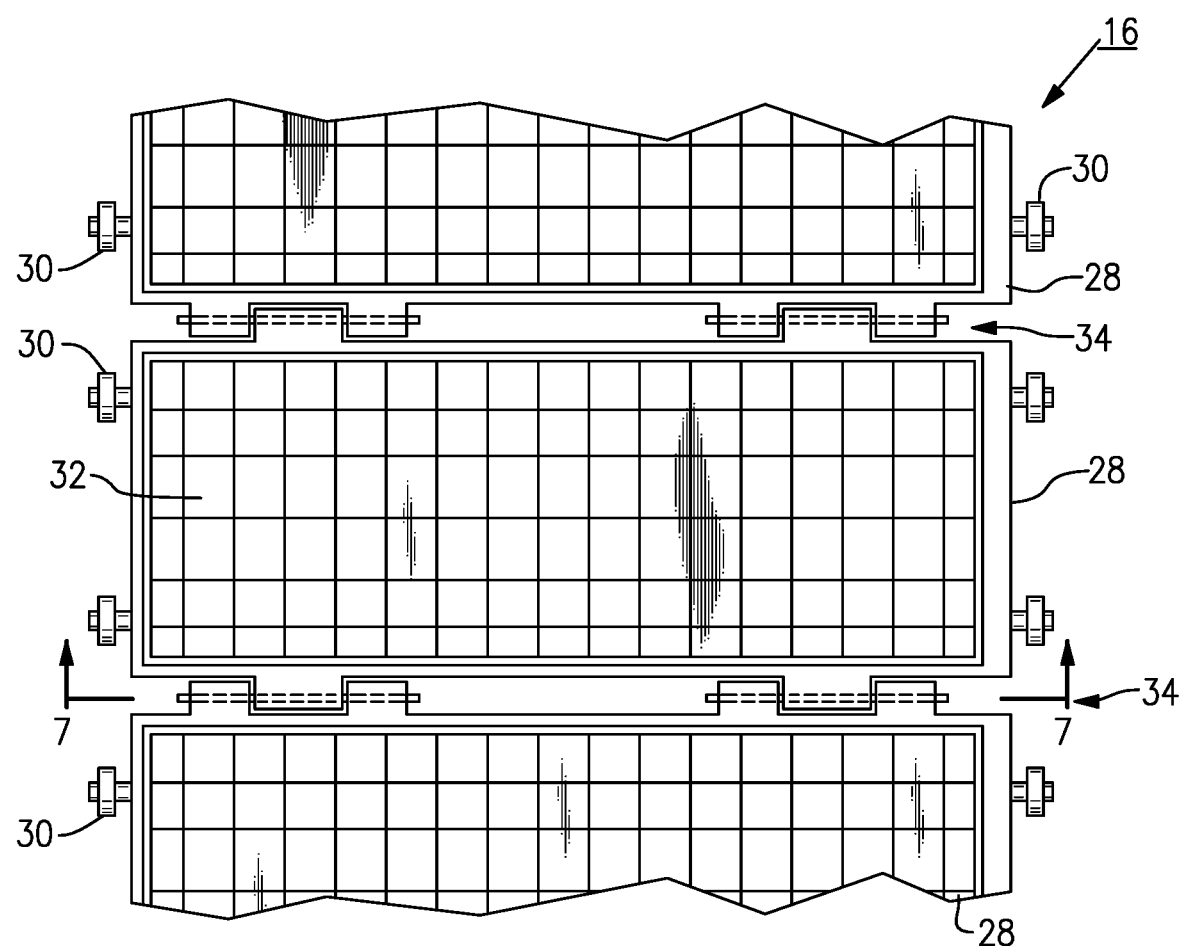
FIG. 6 is a plan view of one of the interconnected floating solar or PV panels together with portions of its neighboring interconnected panels.

FIG. 6 is a plan view of one of the interconnected floating solar or PV panels 32 together with portions of its neighboring panels. The panels are each supported on a generally rectangular float 28, with the floats being linked to one another by a hinge mechanism 34 with a transverse pin or pivot in each hinge member. At right and left sides of each panel are a pair of rollers or wheels 30 that fit the aforementioned track to facilitate deployment and redeployment. Larger wheels may also be present, if used for land-based deployment.

Figure 7:
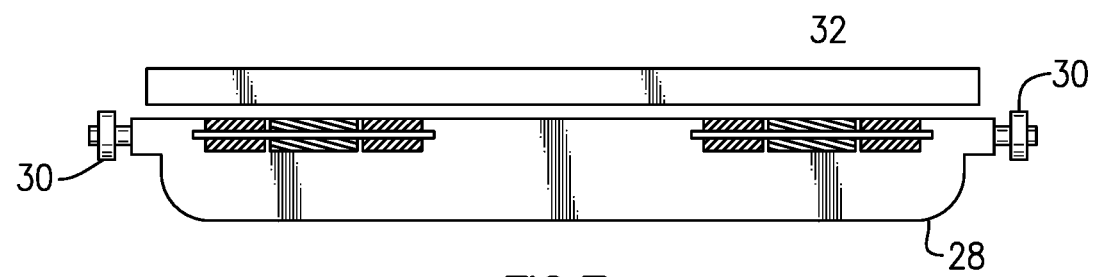
FIG. 7 is an elevation thereof, taken at line 7-7 of FIG. 6.

FIG. 7 is an elevation thereof taken at line 7-7 of FIG. 6, and showing the float portion 28 immediately below the photovoltaic panel 32, and also showing the rollers or wheels 30 with axles extending laterally out from the float portion 28.

Figure 8:
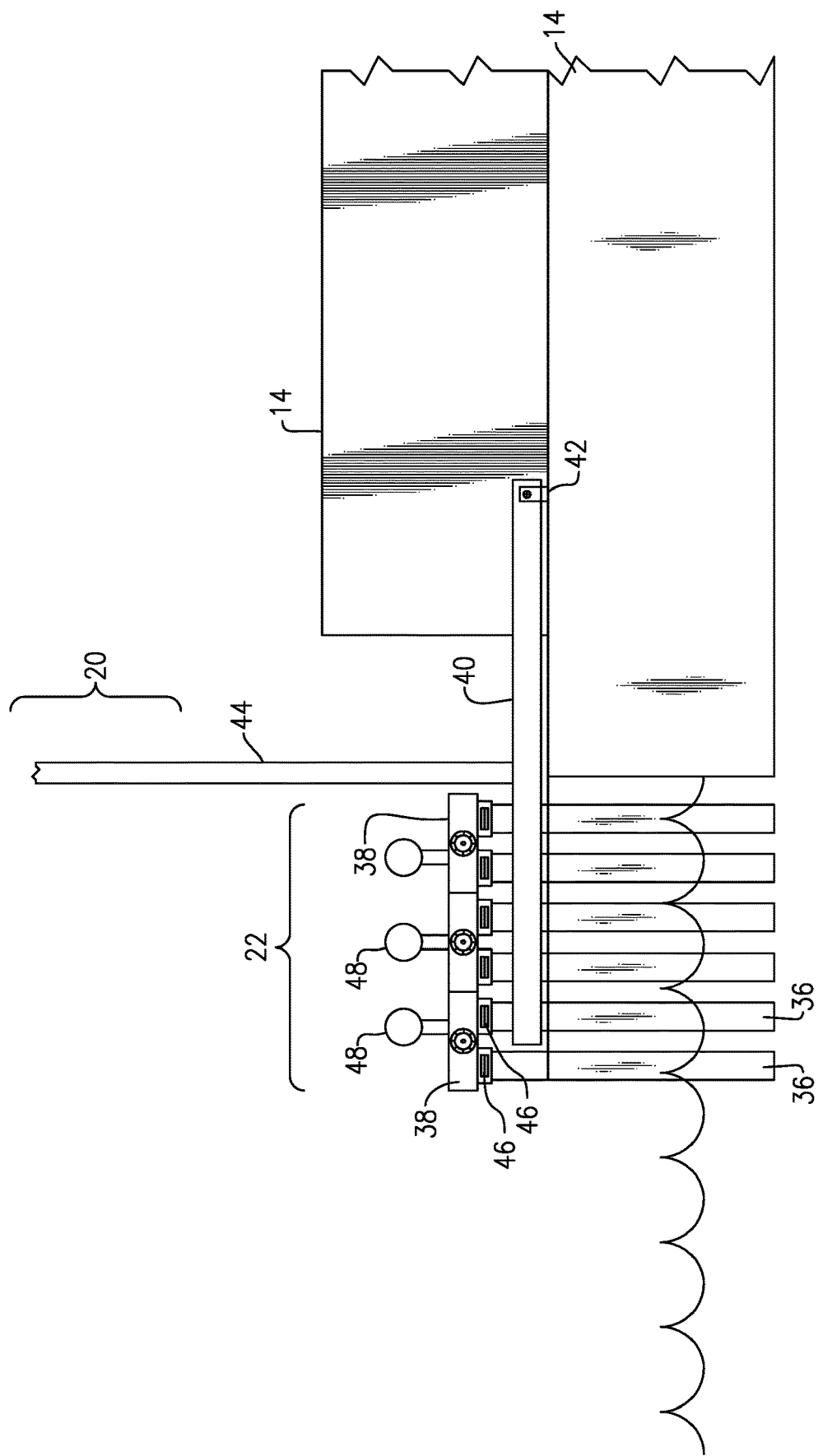
FIG. 8 is an end view of a portion of the transportable floating power station vessel, illustrating one set of wave-action power generation modules.

FIG. 8 is an end view of a portion of the transportable floating power station 10, illustrating one set of wave-action power generation modules 22. Each module 22 includes one or more vertical tubes 36 that extend downward below the water surface to capture wave energy as the wave action pushes and pulls on the air columns within the tubes. At the upper end are air plenums 38, each associated with a respective air turbine which drives a generator (not shown). A check valve assembly 46 is positioned between the top of the tube(s) and the plenum 38, arranged to ensure a unidirectional flow of air into the plenum 38 and thence through the air turbine. Also, each plenum 38 has an associated air storage bladder 48 (or bellows) for holding air under moderate pressure and ensuring smooth steady operation of the air turbine. Also as shown here, the wave-action modules 22 are mounted on a frame 40 (here, disposed generally horizontal) that is pivoted or hinged at a pivot 42 onto the barge or vessel. The tower or post 44 for the wind turbine is also mounted on this frame 40. The frame 40 can be tipped up (to the position shown in FIG. 13) to bring the wave action module(s) 22 and the wind turbine 20 to their redeployed or transport position, and tipped down (See FIG. 8) to place them into their operating position.

Figure 9:
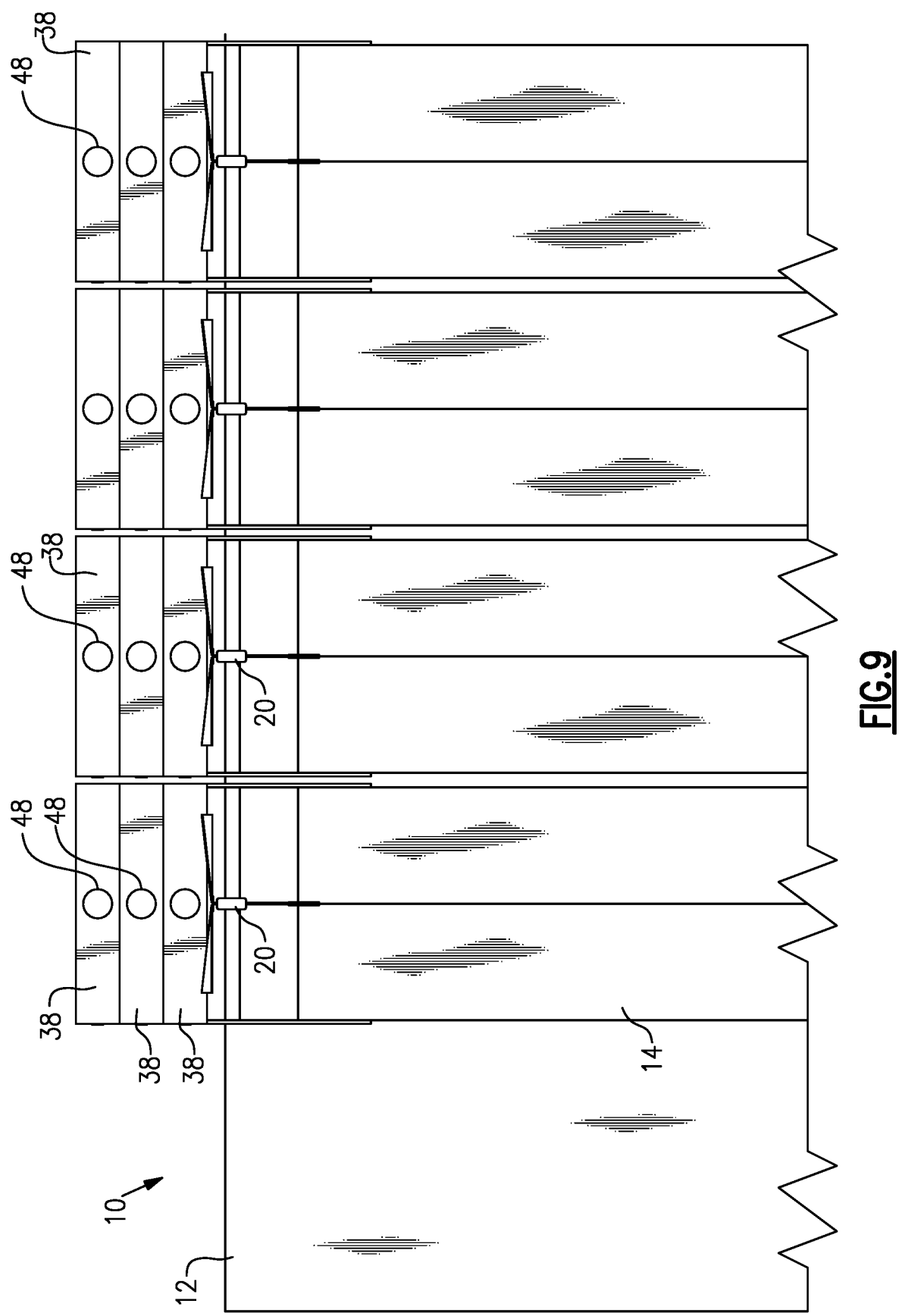
FIG. 9 is a partial top plan view featuring the wind turbines and wave-action forced air generating modules.

FIG. 9 is a partial top plan view featuring the wind turbines 20 and wave-action forced air generating modules 22. Here there are a series of these arrays, with sets of the wave-action modules and wind turbine, the sets arranged side-by-side along the starboard side of the barge 12.

Figure 10:
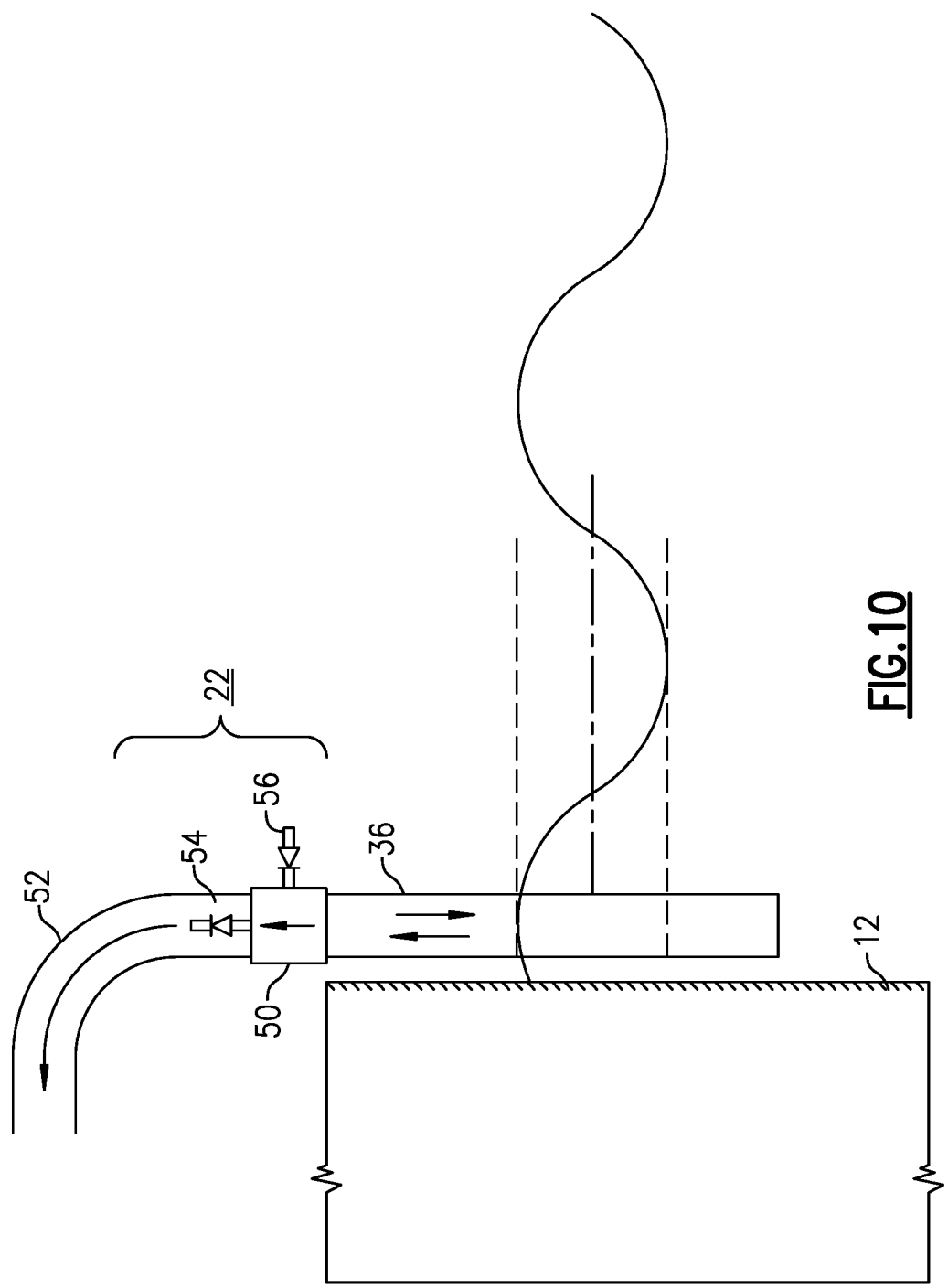
FIG. 10 is a schematic elevation for explaining the concept and operation of one of the wave-action power generation modules.

FIG. 10 is a schematic elevation for explaining the concept and operation of one of the wave-action power generation modules 20. As shown here an air tube 36 is inserted into the water deep enough to that the lower end is beneath the trough of the waves. A displacement volume illustrated here represents the amount of air displaced as water rises and falls within the lower part of the tube 36.

In some embodiments, a floating free piston (not shown) may be employed e.g. at the bottom of the tube to increase the displacement of the air volume. The air moves alternately up and down within this tube, and a check valve mechanism 50, between this tube 36 and a duct 52 leading to the plenum 38, converts this air flow to a unidirectional air flow through the duct into the plenum. As illustrated, an out-flow damper 54 or check valve opens when the wave rises to capture air inflow, and a second or inflow damper 56 or check valve opens when the wave recedes, so that ambient air flows down via the check valve inflow damper 56 and into the tube 36, and not air from the plenum.

Figure 11:
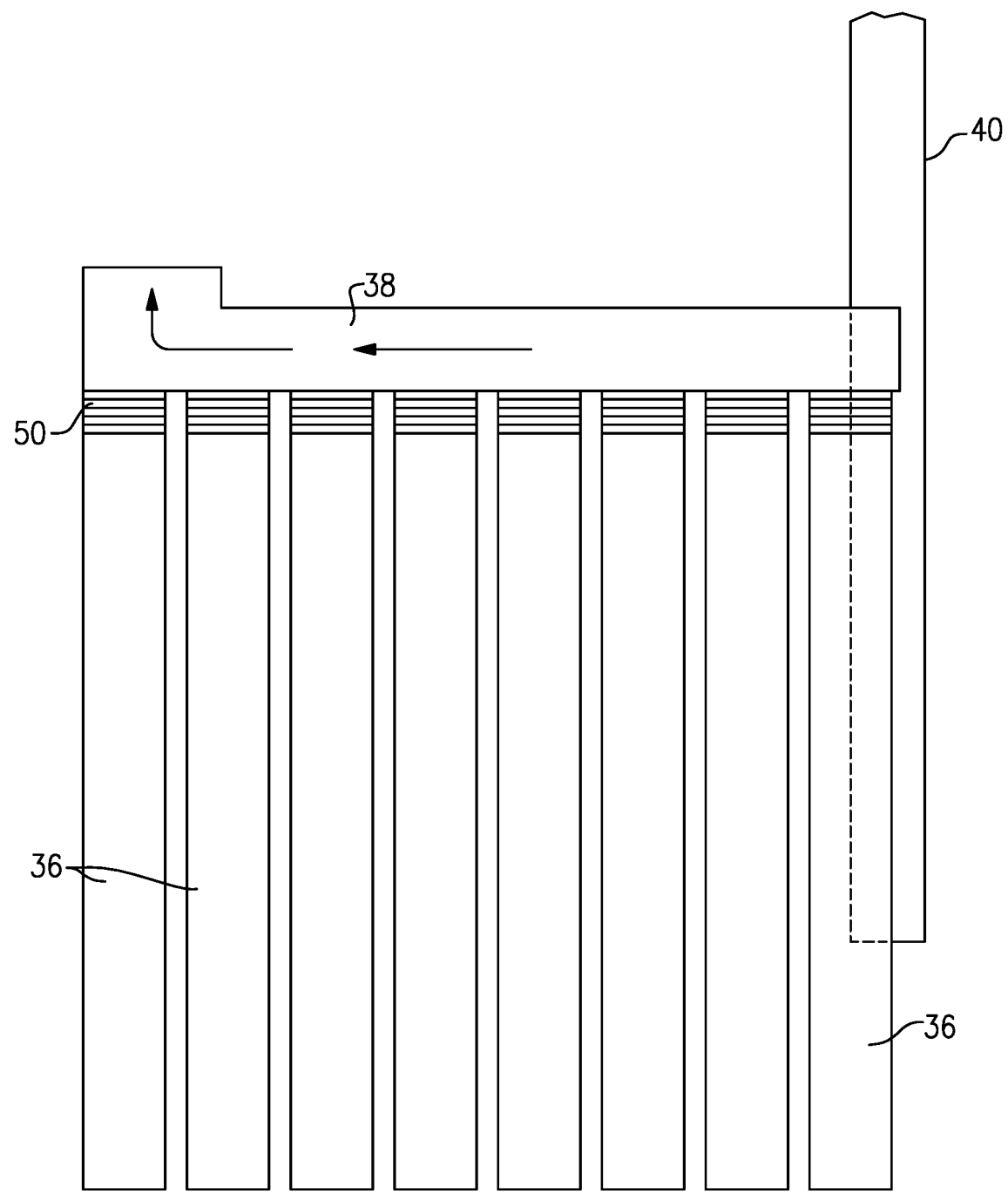
FIG. 11 is a schematic elevation of a multiple of these air tubes with check valve or uni-directional dampers and the high static pressure air flow plenum of the wave-action power generation module.

FIG. 11 is a schematic elevation of a multiple of these air tubes 36 with check valve or uni-directional dampers 50 and the high static pressure air flow plenum 38 of the wave-action power generation module. A portion of the supporting frame or mounting 40 is also shown here, in part. As illustrated, each vertical forced air tube is fitted at its upper end with an inlet air check valve or damper and an outlet air check valve or damper, as discussed earlier. When the peak of the wave enters the forced air tube 36, the air volume is reduced, forcing air through the outlet air check valve 54, while closing the inlet air check valve 56. When the trough of the wave reaches the tube 36 and the wave recedes, the outlet air check valve 54 closes, and the inlet air check valve 56 opens. As mentioned before, the plenum may be fitted with a storage device, e.g., a bladder, that holds a volume of air at the high static pressure.

Figure 12:
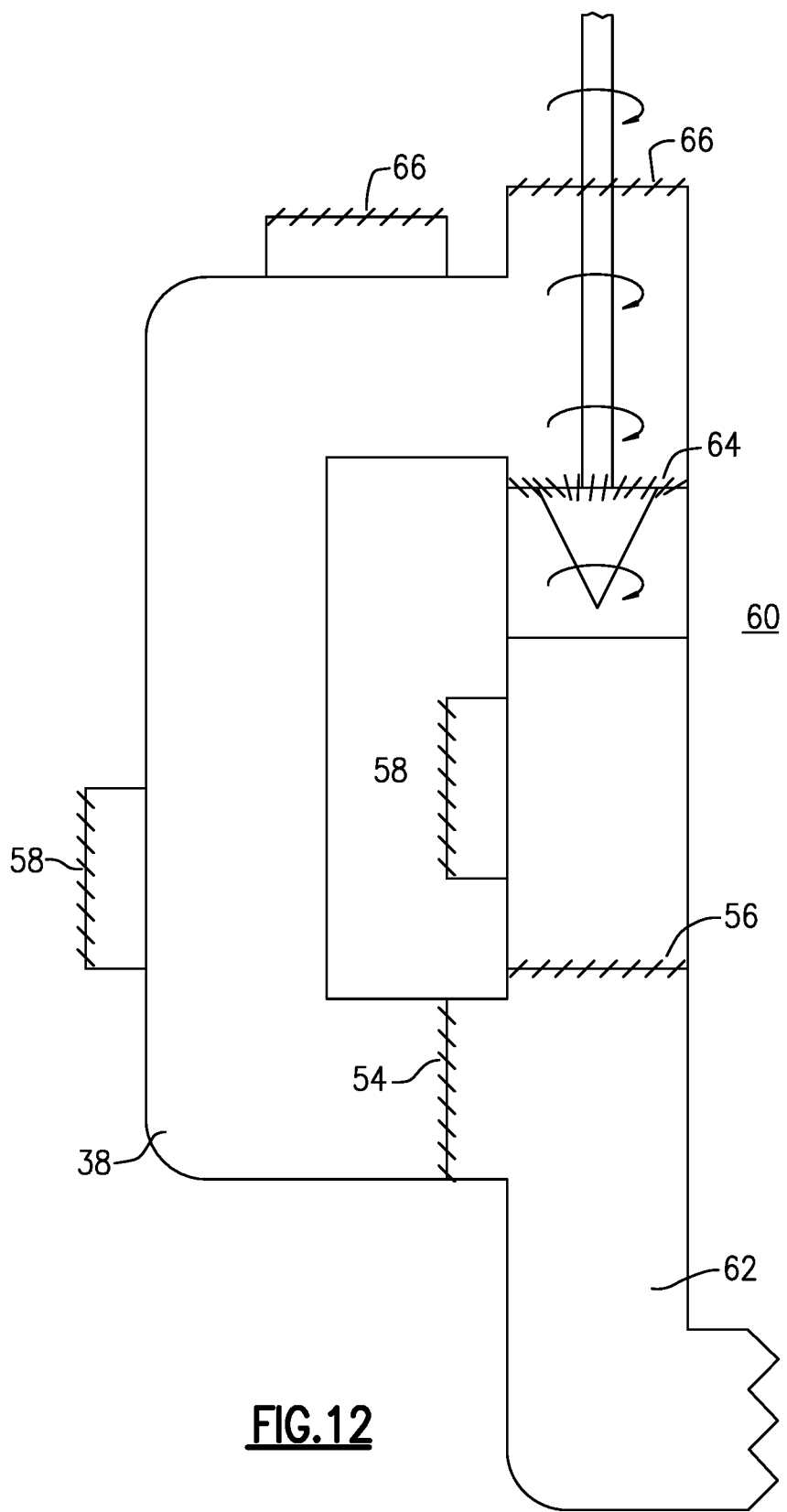
FIG. 12 is a schematic view for explaining the wave-induced airflow path and air turbine operation for the wave-action power generation module.

FIG. 12 is an alternative schematic view for explaining the wave-induced airflow path 60 and air turbine operation for the wave-action power generation module. A lower end 62 of this connects with the vertical forced air tube 36. Here is illustrated the outlet air check valve, in the form of positive pressure louvers 56 at the inlet to the plenum, and negative pressure outlet louvers 54 forming the inlet air check valve, connected with the vertical forced air tube 36. There is also a set of negative pressure inlet louvers 58 to the plenum and a set of low-static relief louvers 58 and a set of high static relief louvers 66 on the bypass duct that connects between the duct from the vertical forced air tube and the outlet side of the air turbine. This arrangement demonstrates one means of maintaining single-direction air flow through the turbine 64. In this embodiment, positive pressure louvers open and close at the same time, and are mechanically linked. Negative pressure louvers are also mechanically linked to each other and close and open at the same time. The positive and negative pressure outlet louvers are never both open or both closed at the same time.

Figure 13:
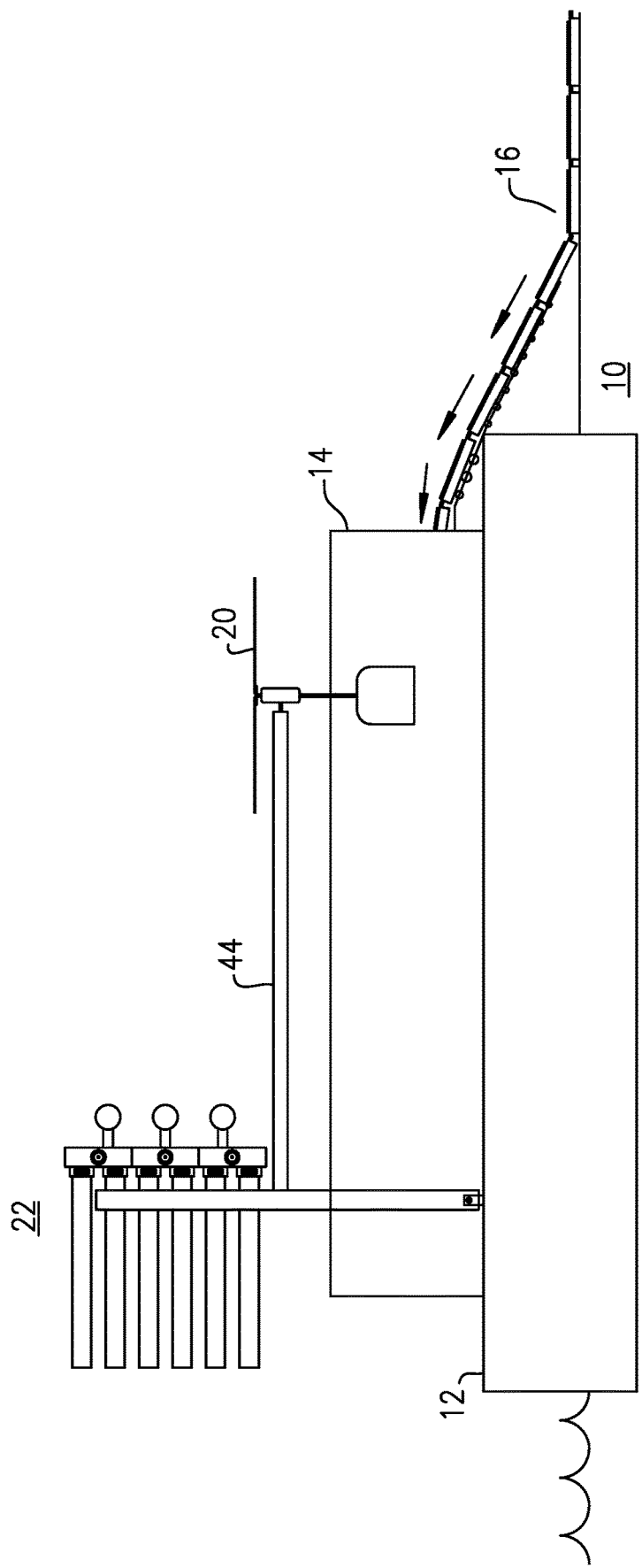
FIG. 13 is an end view of the power generating station showing the wave-action forced air tube assembly(-ies) and the associated wind turbine(s) and tower(s) in tipped or fully retracted position, and the array of inter-connected PV panels in process of being retracted back on board.

FIG. 13 is an end view of the power generating station 10 showing the wave-action forced air tube assembly(-ies) 22 and the associated wind turbine(s) 20 and tower(s) 44 in tipped or fully retracted position, and the array of interconnected PV panels 16 in process of being retracted back into the deployment housing 14 or container module to prepare the barge for transport by water to a location where supplemental electric power is needed.

FIG. 14 is a front or bow-end view of the power generating station of another similar embodiment, partly cutaway, again showing the arrangements of wind, wave, and solar energy collection equipment. Here, in place of the track mechanism described earlier, a housing or container 14' on the barge holds a rotary roller drum or drums 24', with the chain of solar or PV panels being wound up on the drum 24'. There would be a roller drum for each of the series of chains of interconnected PV panels. The roller drum is rotated clockwise (in this embodiment) to retract the floating PV panels, and rotated counter-clockwise to extend them out onto the water surface. In this embodiment the storage batteries 26 are contained in a number of individual battery compartments.

Figure 15:
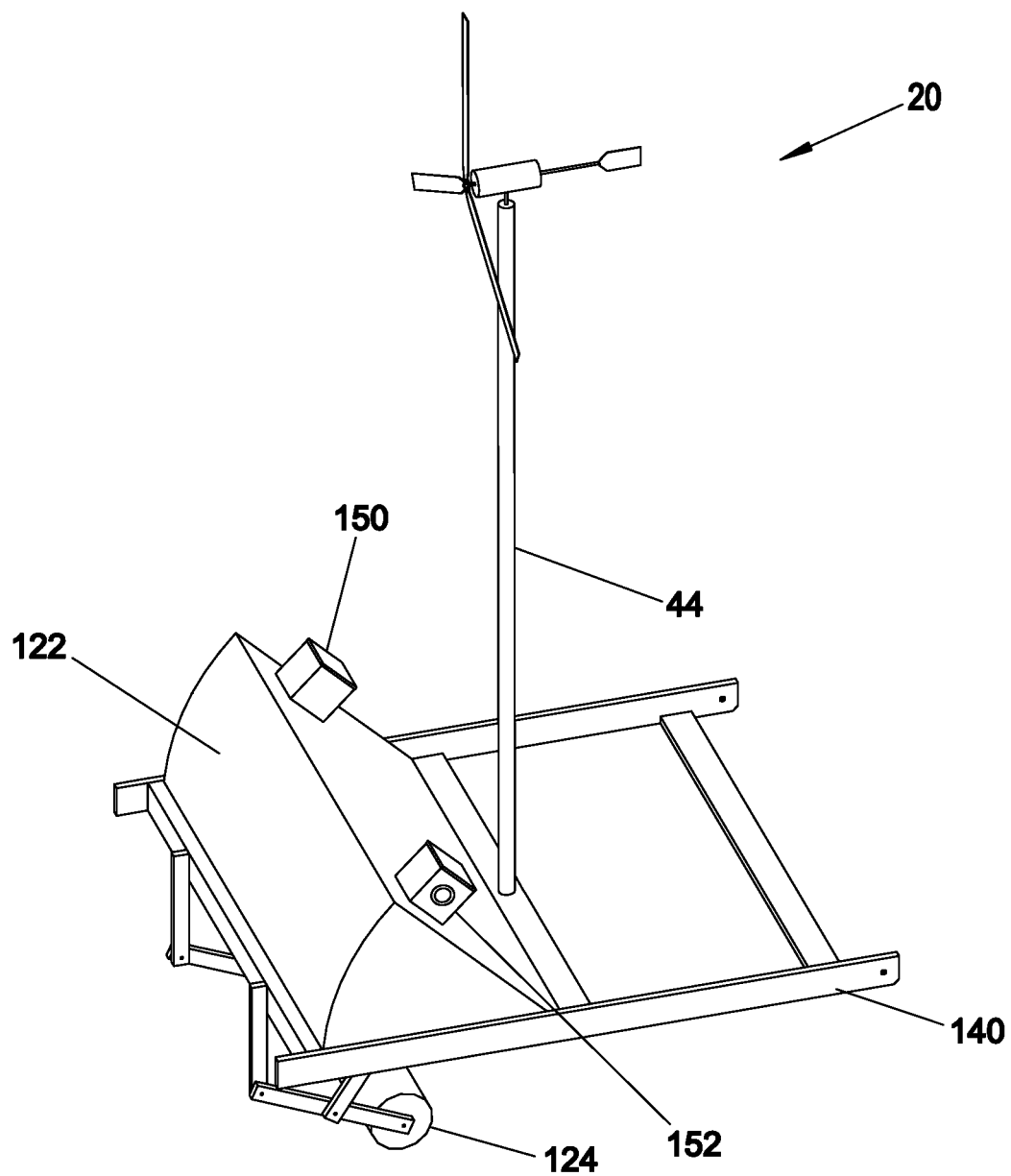
FIG. 15 is a perspective view of an alternative wave-action energy capturing mechanism, here in the form of a float and bellows mechanism
Figure 16:
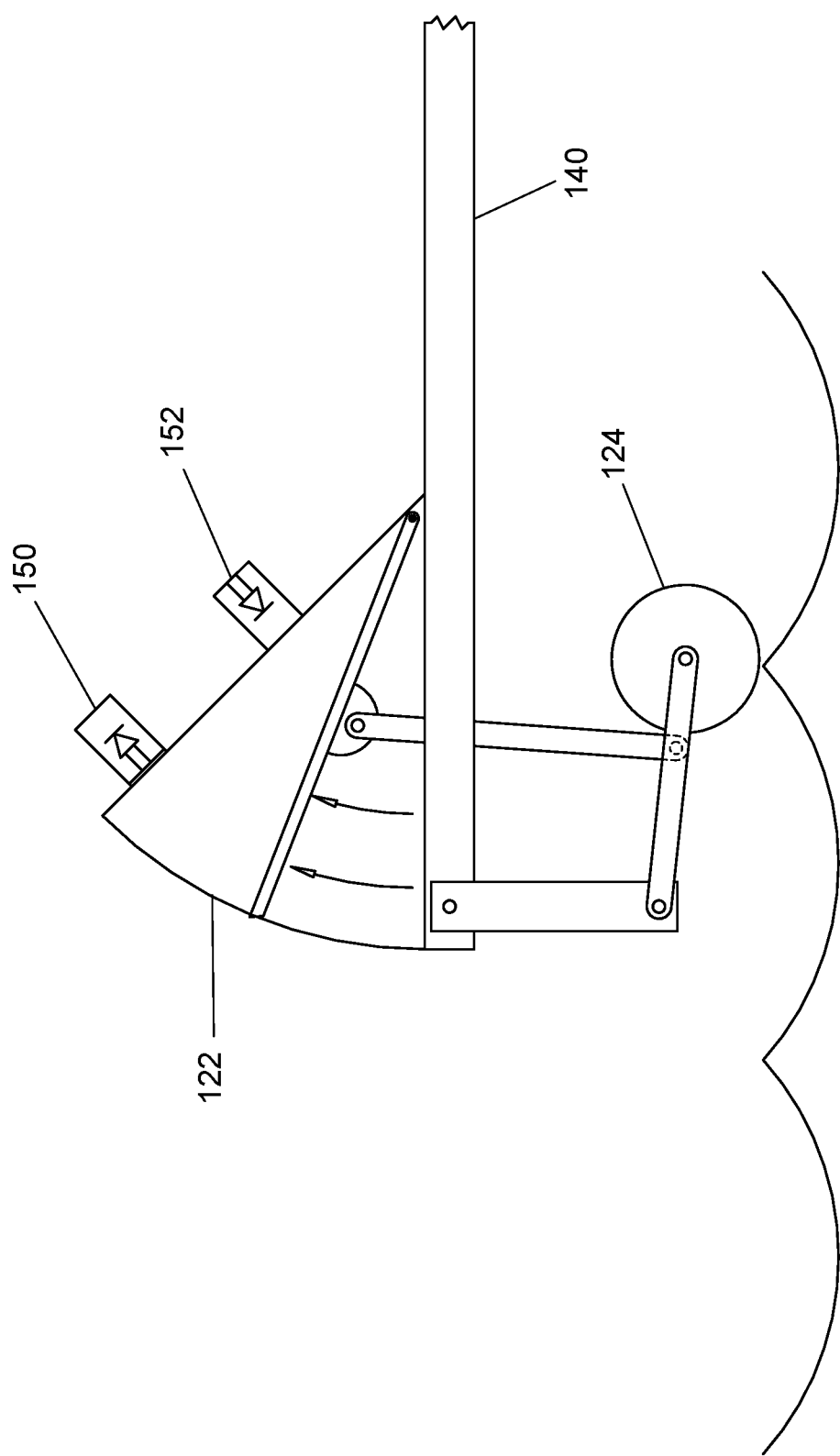
FIGS. 16 and 17 are side elevations for describing the action thereof.
Figure 17:
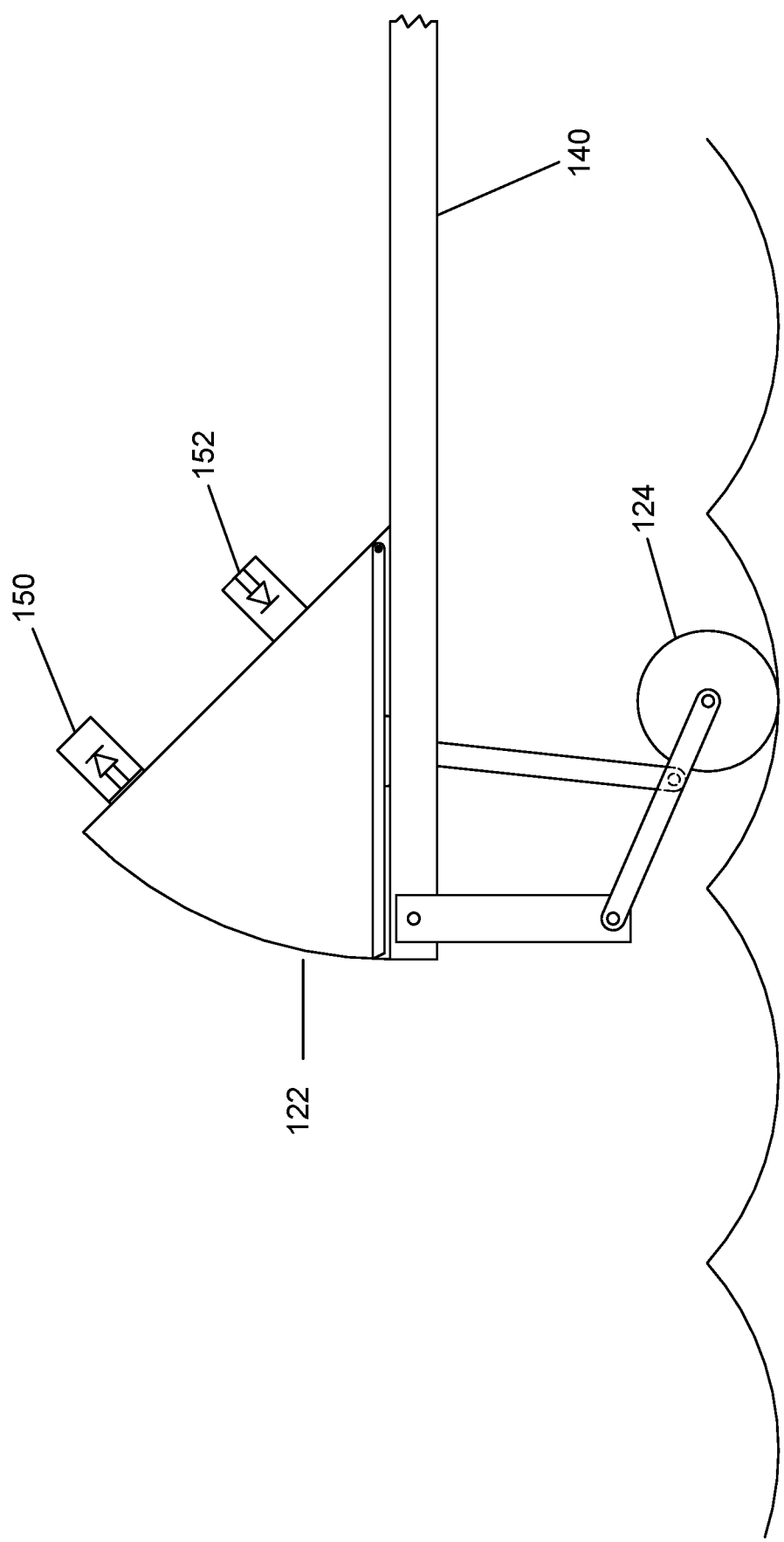

FIG. 15 shows an alternative to the multiple tube wave-action generation module 22, here in the form of a bellows 122 and float 124 which may be mounted on a frame 140 that would replace the frame 40 described earlier, and on which the wind turbine 20 is mounted. Here a generally cylindrical float 124 is supported on a front of the bellows or variable volume air chamber 12 to drive a movable side of the bellows 122 up and down with the crests and troughs of the water waves. An outflow check valve 150 which supplies the driven airflow to the turbine (not shown here) allows one-way flow, and an in-flow turbine 152 pulls in air to the bellows from the low pressure side of the turbine. In this embodiment, the bellows 122 collapses and expands with the wave-generated motion of the float 124, and this provides a high-volume air flow to the turbine for electric generation.

Figure 18:
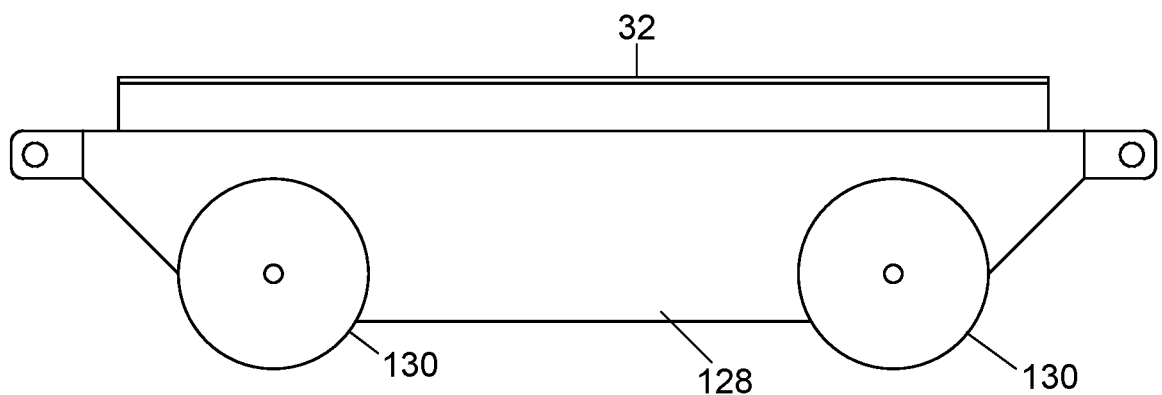
FIG. 18 is a schematic view of a land-based embodiment.

In a dry-land setting, which may be paved or unpaved, a relatively flat area such as a parking lot could be used to deploy the solar or PV panels from steel containers, e.g., shipping containers. The solar panels would be mounted on wheeled platforms (in place of the floats) such that they can be quickly deployed from the steel containers onto the ground and quickly rolled into position. An example of one solar panel with wheeled platform is shown in FIG. 18, with solar panel 32 situated on an upper side of the wheeled platform 128. which here is shown with a wheel 130 at each corner. Each platform 128 can be linked via a pivotable or flexible linkage, to the next in the same fashion as the arrangement shown in FIGS. 6 and 7. This linkage may have more than one degree of freedom.

Many variations of these arrangement will become apparent to persons in this field, so the invention is not to be limited to the illustrated arrangement only. Rather the scope of the invention is to be measured from the appended claims.

I claim:

1. A floating transportable energy collection and storage station, comprising:
    a floating barge or vessel configured to float on and travel along or across a body of water;
    an array of interconnected floating photovoltaic panels arranged in one or more chains of hingedly interconnected panels;
    a housing mounted upon said barge or vessel, including one or more tracks within the housing, each track being associated with a respective one of said one or more chains of interconnected panels, each said track being formed as a continuous plurality of vertically spaced portions and defining a coiled or folded path for the respective chain of interconnected panels, and with said panels having guide members fitting movably into said tracks such that the respective chain is guided into and travels along the track in said coiled or folded path when the chain of interconnected panels is deployed out or redeployed back into the housing; and
    a mechanism for deploying said one or more chains of interconnected panels out from one side of said housing and onto a water surface of said body of water at the one side of said barge or vessel, and for redeploying or retracting said chain of interconnected panels back into said housing on its associated track.

2. A floating transportable energy collection and storage station, comprising:
    a floating barge or vessel configured to float on and travel along or across a body of water;
    an array of interconnected floating photovoltaic panels arranged in one or more chains of hingedly interconnected panels;
    a housing mounted upon said barge or vessel, including one or more tracks within the housing, each track being associated with a respective one of said one or more chains of interconnected panels, with said panels having guide members fitting movably into said tracks such that the respective chain is guided into and travels along the track when the chain of interconnected panels is deployed out or redeployed back into the housing; and
    a mechanism for deploying said one or more chains of interconnected panels out from one side of said housing and onto a water surface of said body of water at the one side of said barge or vessel, and for redeploying or retracting said chain of interconnected panels back into said housing on its associated track within said housing; and further comprising:
    at least one wave-action generation assembly, including at least one vertical tube adapted to be inserted below said water surface of said body of water alongside said barge or vessel, a check valve arrangement for converting up and down air displacement within said vertical tube to a unidirectional air flow, and an air path that directs said unidirectional air flow through an air turbine.

3. A floating transportable energy collection and storage station, comprising:
- a floating barge or vessel configured to float on and travel along or across a body of water;
- an array of interconnected floating photovoltaic panels arranged in one or more chains of hingedly interconnected panels;
- a housing mounted upon said barge or vessel, including one or more tracks within the housing, each track being associated with a respective one of said one or more chains of interconnected panels, with said panels having guide members fitting movably into said tracks such that the respective chain is guided into and travels along the track when the chain of interconnected panels is deployed out or redeployed back into the housing; and
- a mechanism for deploying said one or more chains of interconnected panels out from one side of said housing and onto a water surface of said body of water at the one side of said barge or vessel, and for redeploying or retracting said chain of interconnected panels back into said housing on its associated track within said housing; and further comprising:
- at least one wave-action generation assembly, including at least one bellows mechanism with a movable portion wherein motion of the movable portion causes said bellows mechanism to collapse and expand, a float adapted to be placed onto a water surface of said body of water alongside said barge or vessel, a mechanism mechanically connecting said float with said movable portion of said bellows, and first and second check valve arrangements respectively for suppling a positive pressure air flow for an air turbine, and drawing in low pressure airflow from said turbine to said bellows mechanism.

4. The floating transportable energy collection and storage station of claim 1 further comprising a bank or battery of electrical storage devices disposed within the barge or vessel to store electric energy collected by said array of interconnected floating photovoltaic panels.

5. The floating transportable energy collection and storage station of claim 4 comprising a plurality of individual battery compartments, with one or more of said electrical storage devices being disposed respectively within each of said compartments.

6. The floating transportable energy collection and storage station of claim 2 wherein said wave-action generating assembly is supported on a frame that is pivotable on a hinge mounted on said floating barge or vessel, and adapted such that the wave-action generating assembly and frame can be lifted up from the water for transport and lowered down into the water for power generation.

7. The floating transportable energy collection and storage station of claim 1 wherein said mechanism for deploying said one or more chains of hingedly interconnected panels includes at least one deployment ramp configured for angling an associated one of said one or more chains of interconnected panels between said housing and a surface of the body of water.

8. The floating transportable energy collection and storage station of claim 1 wherein said interconnected panels each include a generally rectangular float, with each said float including a hinge mechanism linking said float to an adjacent float.

9. The floating transportable energy collection and storage station of claim 1 wherein at left and right sides thereof each said panel includes a pair of rollers which are adapted for fitting within the respective track.

10. The floating transportable energy collection and storage station of claim 9 wherein said tracks are in the form of channel members adapted to receive said pairs of rollers.

* * * * *